(12) United States Patent
Lee et al.

(10) Patent No.: US 12,433,052 B2
(45) Date of Patent: Sep. 30, 2025

(54) IMAGE SENSOR STRUCTURE

(71) Applicant: Powerchip Semiconductor Manufacturing Corporation, Hsinchu (TW)

(72) Inventors: Shih-Ping Lee, Hsinchu (TW); Chih-Ping Chung, Hsinchu (TW); Jhih Fan Tu, Hsinchu County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 450 days.

(21) Appl. No.: 17/973,545

(22) Filed: Oct. 26, 2022

(65) Prior Publication Data

US 2024/0105749 A1    Mar. 28, 2024

(30) Foreign Application Priority Data

Sep. 26, 2022   (TW) .................................. 111136316

(51) Int. Cl.
*H01L 27/146*    (2006.01)
*H10F 39/00*    (2025.01)
*H10F 39/12*    (2025.01)

(52) U.S. Cl.
CPC ......... *H10F 39/807* (2025.01); *H10F 39/199* (2025.01); *H10F 39/80373* (2025.01)

(58) Field of Classification Search
CPC .................. H10F 39/807; H10F 39/199; H10F 39/80373; H10F 39/8053; H10F 39/8063;

(Continued)

(56) References Cited

U.S. PATENT DOCUMENTS 10,147,756 B2    12/2018  Cheng et al.
10,181,492 B2 *   1/2019  Ihara ..................... H10F 39/199

(Continued)

FOREIGN PATENT DOCUMENTS

CN    118693112 A  *  9/2024  ....... H01L 27/14603
TW    201935672        9/2019

(Continued)

OTHER PUBLICATIONS

"Office Action of Taiwan Counterpart Application", issued on May 22, 2023, p. 1-p. 9.

(Continued)

*Primary Examiner* — Ajay Ojha
*Assistant Examiner* — Tsz K Chiu
(74) *Attorney, Agent, or Firm* — JCIPRNET

(57) ABSTRACT

An image sensor structure including a substrate, a pixel structure, and a deep trench isolation (DTI) structure is provided. The substrate includes a first side and a second side opposite to each other. The pixel structure includes a transfer transistor, a light sensing device, and a floating diffusion region. The transfer transistor includes a first gate. The first gate is disposed on the first side of the substrate. The light sensing device is disposed in the substrate and is located on one side of the first gate. The floating diffusion region is disposed in the substrate and is located on another side of the first gate. The DTI structure extends into the substrate from the second side of the substrate. The top-view pattern of the floating diffusion region does not overlap the top-view pattern of the DTI structure.

10 Claims, 12 Drawing Sheets

(58) Field of Classification Search
CPC ...... H10F 39/813; H10F 39/18; H10F 39/802; H10F 39/184–1847
See application file for complete search history.

(56) References Cited

U.S. PATENT DOCUMENTS

| | | | |
|---|---|---|---|
| 10,276,620 B2* | 4/2019 | Chien | H10F 39/8067 |
| 2014/0299957 A1* | 10/2014 | Hu | H10F 39/807 |
| | | | 257/431 |
| 2016/0064430 A1* | 3/2016 | Lee | H10F 39/199 |
| | | | 257/292 |
| 2017/0373117 A1 | 12/2017 | Chou et al. | |
| 2018/0182806 A1* | 6/2018 | Jin | H10F 39/805 |
| 2018/0286895 A1* | 10/2018 | Watanabe | H10F 39/8063 |
| 2020/0006410 A1 | 1/2020 | Wu et al. | |
| 2020/0266229 A1* | 8/2020 | Takahashi | H10F 39/018 |
| 2022/0302191 A1* | 9/2022 | Jin | H10F 39/811 |
| 2022/0344382 A1* | 10/2022 | Hsieh | H10F 39/011 |

FOREIGN PATENT DOCUMENTS

| | | |
|---|---|---|
| TW | 201946260 | 12/2019 |
| TW | 202107722 | 2/2021 |
| TW | 202111939 | 3/2021 |
| TW | 202139442 | 10/2021 |
| TW | 202205651 | 2/2022 |
| TW | 202236645 | 9/2022 |

OTHER PUBLICATIONS

Y. Kitamura et al., "Suppression of Crosstalk by Using Backside Deep Trench Isolation for 1.12μm Backside Illuminated CMOS Image Sensor", 2012 International Electron Devices Meeting, Dec. 10-13, 2012, pp. 1-4.

* cited by examiner

IMAGE SENSOR STRUCTURE

CROSS-REFERENCE TO RELATED APPLICATION

This application claims the priority benefit of Taiwanese application no. 111136316, filed on Sep. 26, 2022. The entirety of the above-mentioned patent application is hereby incorporated by reference herein and made a part of this specification.

BACKGROUND

Technical Field

The invention relates to a semiconductor structure, and particularly relates to an image sensor structure.

Description of Related Art

Currently, the image sensor is widely used in many modern electronic devices (e.g., smart phone or digital camera). In addition, in some image sensors (e.g., backside illuminated (BSI) image sensor), the deep trench isolation (DTI) structure is used to reduce the optical crosstalk and the electrical crosstalk between adjacent pixels. Furthermore, in the process of forming the DTI structure, the deep trench is first formed on the back side of the substrate by the dry etching process, and then the DTI structure is formed in the deep trench. However, the plasma of the dry etching process will damage the floating diffusion (FD) region, thereby causing increase in the fixed pattern noise (FPN), and thus causing the degradation of the image quality.

SUMMARY

The invention provides an image sensor structure, which can reduce the fixed pattern noise and effectively improve the image quality.

The invention provides an image sensor structure, which includes a substrate, a pixel structure, and a deep trench isolation (DTI) structure. The substrate includes a first side and a second side opposite to each other. The pixel structure includes a transfer transistor, a light sensing device, and a floating diffusion region. The transfer transistor includes a first gate. The first gate is disposed on the first side of the substrate. The light sensing device is disposed in the substrate and is located on one side of the first gate. The floating diffusion region is disposed in the substrate and is located on another side of the first gate. The DTI structure extends into the substrate from the second side of the substrate. The top-view pattern of the floating diffusion region does not overlap the top-view pattern of the DTI structure.

According to an embodiment of the invention, the image sensor structure may be a backside illuminated (BSI) image sensor structure.

According to an embodiment of the invention, in the image sensor structure, the light sensing device may be a photodiode.

According to an embodiment of the invention, in the image sensor structure, the vertical projection of the floating diffusion region may fall outside the DTI structure.

According to an embodiment of the invention, in the image sensor structure, the top-view pattern of the DTI structure may surround the top-view pattern of the floating diffusion region.

According to an embodiment of the invention, in the image sensor structure, the top-view pattern of the DTI structure may surround the top-view pattern of the light sensing device.

According to an embodiment of the invention, in the image sensor structure, the top-view pattern of the DTI structure may have an opening. The top-view pattern of the floating diffusion region may be located in the opening.

According to an embodiment of the invention, the image sensor structure may include a plurality of the pixel structures.

According to an embodiment of the invention, in the image sensor structure, two pixel structures may share the floating diffusion region.

According to an embodiment of the invention, in the image sensor structure, the pixel structure may further include a reset transistor, a source follower transistor, and a row select transistor. The two pixel structures may share the reset transistor, the source follower transistor, and the row select transistor.

According to an embodiment of the invention, in the image sensor structure, the reset transistor may include a second gate. The second gate is disposed on the first side of the substrate. The source follower transistor may include a third gate. The third gate is disposed on the first side of the substrate. The row select transistor may include a fourth gate. The fourth gate is disposed on the first side of the substrate.

According to an embodiment of the invention, in the image sensor structure, the top-view pattern of the second gate, the top-view pattern of the third gate, and the top-view pattern of the fourth gate may overlap the top-view pattern of the DTI structure.

According to an embodiment of the invention, in the image sensor structure, the vertical projection of the second gate, the vertical projection of the third gate, and the vertical projection of the fourth gate may fall on the DTI structure.

According to an embodiment of the invention, in the image sensor structure, four pixel structures may share the floating diffusion region.

According to an embodiment of the invention, in the image sensor structure, the pixel structure may further include a reset transistor, a source follower transistor, and a row select transistor. The four pixel structures may share the reset transistor, the source follower transistor, and the row select transistor.

According to an embodiment of the invention, in the image sensor structure, the reset transistor may include a second gate. The second gate is disposed on the first side of the substrate. The source follower transistor may include a third gate. The third gate is disposed on the first side of the substrate. The row select transistor may include a fourth gate. The fourth gate is disposed on the first side of the substrate.

According to an embodiment of the invention, in the image sensor structure, the top-view pattern of the second gate, the top-view pattern of the third gate, and the top-view pattern of the fourth gate may not overlap the top-view pattern of the DTI structure.

According to an embodiment of the invention, in the image sensor structure, the vertical projection of the second gate, the vertical projection of the third gate, and the vertical projection of the fourth gate may fall outside the DTI structure.

According to an embodiment of the invention, in the image sensor structure, the top-view pattern of the DTI structure may surround the top-view pattern of the second gate, the top-view pattern of the third gate, and the top-view pattern of the fourth gate.

According to an embodiment of the invention, the image sensor structure may further include a shallow trench isolation (STI) structure. The STI structure extends into the substrate from the first side of the substrate. The STI structure may define an active region in the substrate. The light sensing device and the floating diffusion region may be disposed in the active region.

Based on the above description, in the image sensor structure according to the invention, the top-view pattern of the floating diffusion region does not overlap the top-view pattern of the DTI structure. Therefore, in the manufacturing process of the DTI structure, the plasma of the dry etching process can be prevented from damaging the floating diffusion region, thereby reducing the fixed pattern noise and effectively improving the image quality.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. Furthermore, the features in the top view and the features in the cross-sectional view are not drawn to the same scale. In fact, the dimensions of the various features may be arbitrarily increased or reduced for clarity of discussion.

Figure 1:
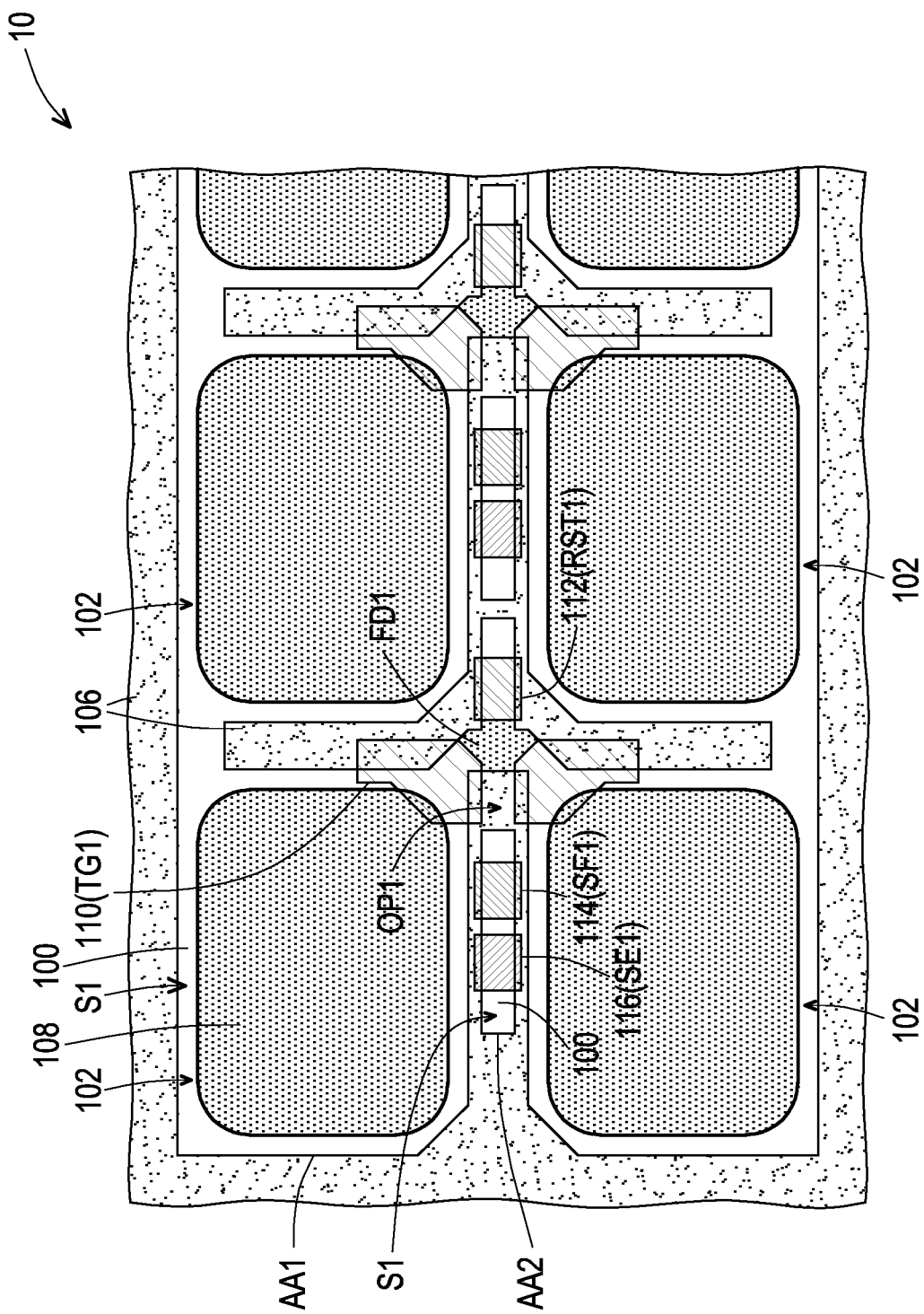
FIG. 1 and FIG. 2 are schematic top views illustrating an image sensor structure according to some embodiments of the invention.
Figure 2:
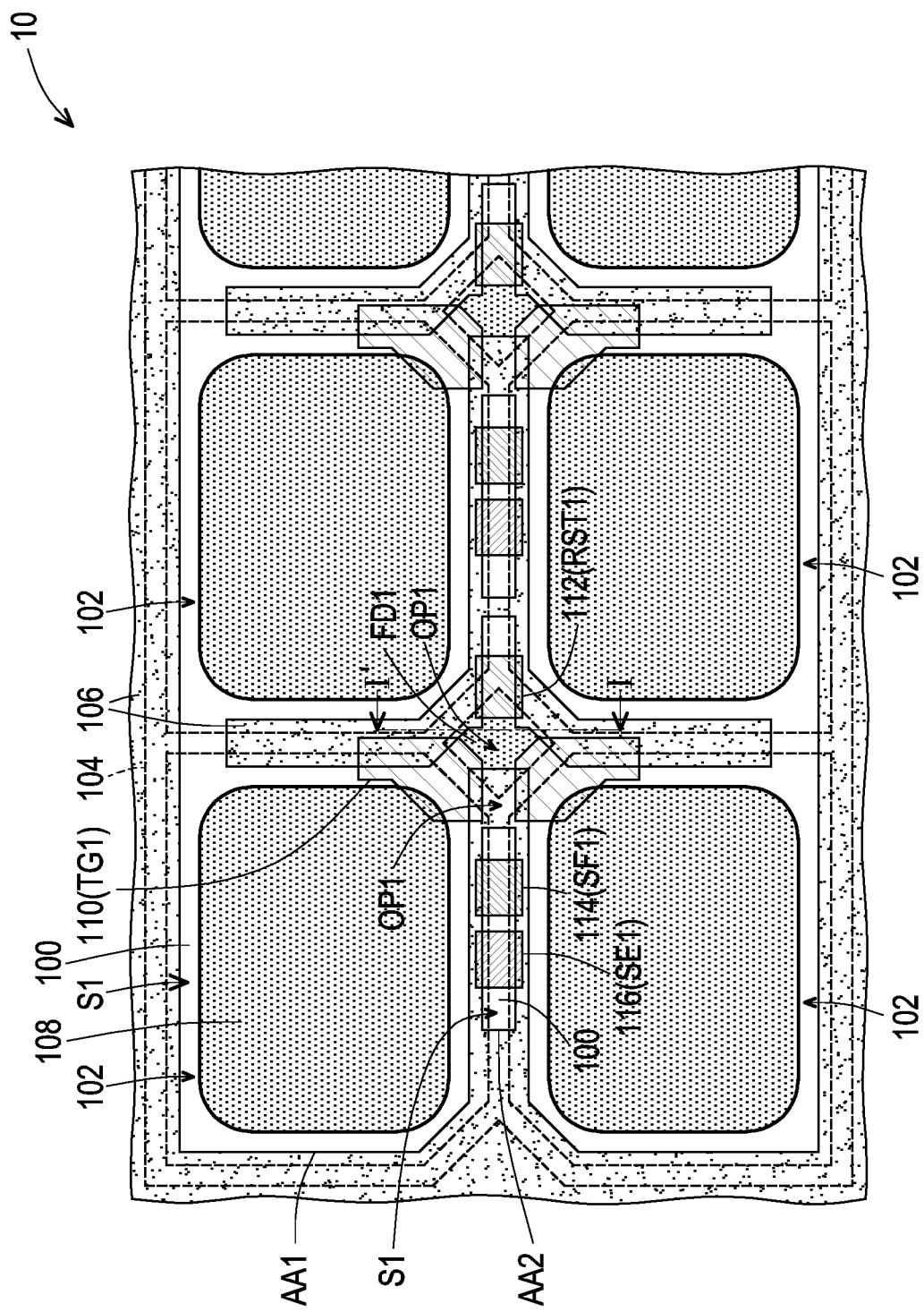
Figure 3:
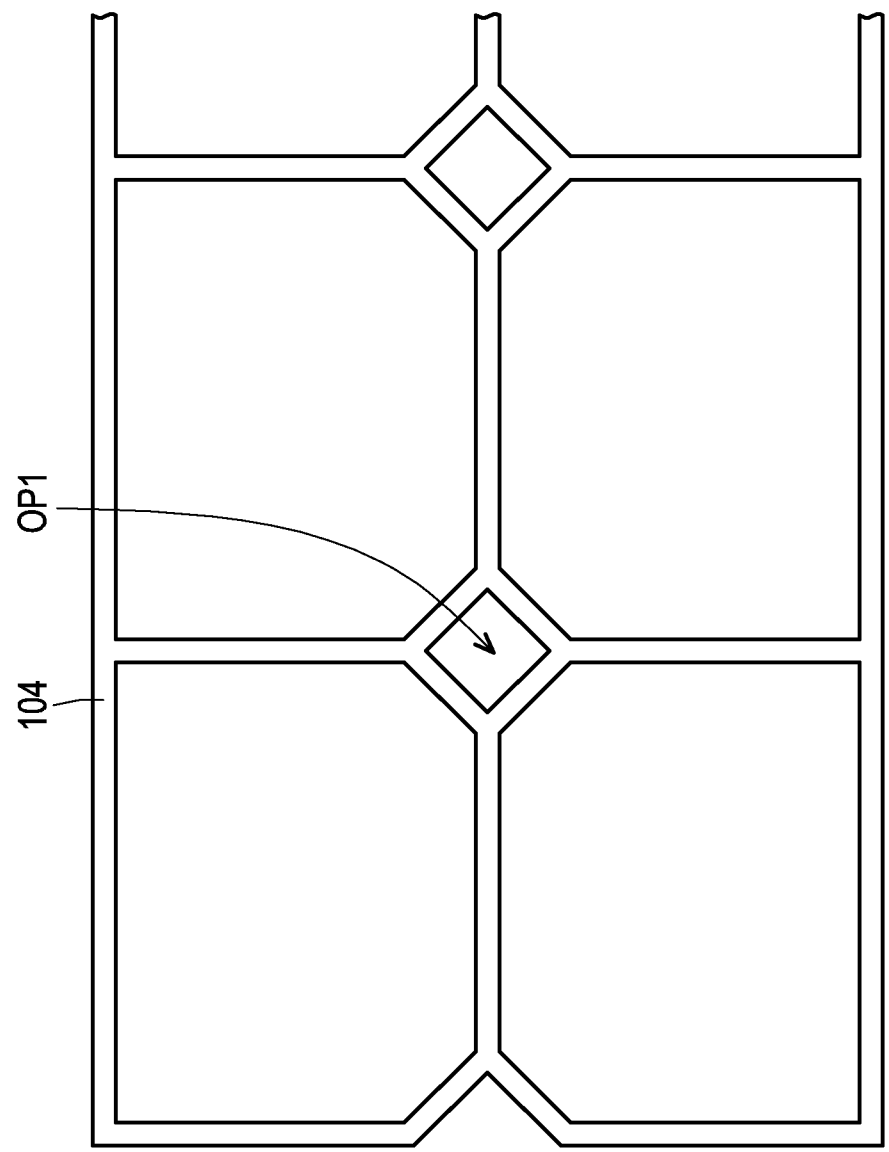
FIG. 3 is a schematic top view illustrating the deep trench isolation (DTI) structure in FIG. 2.
Figure 4:
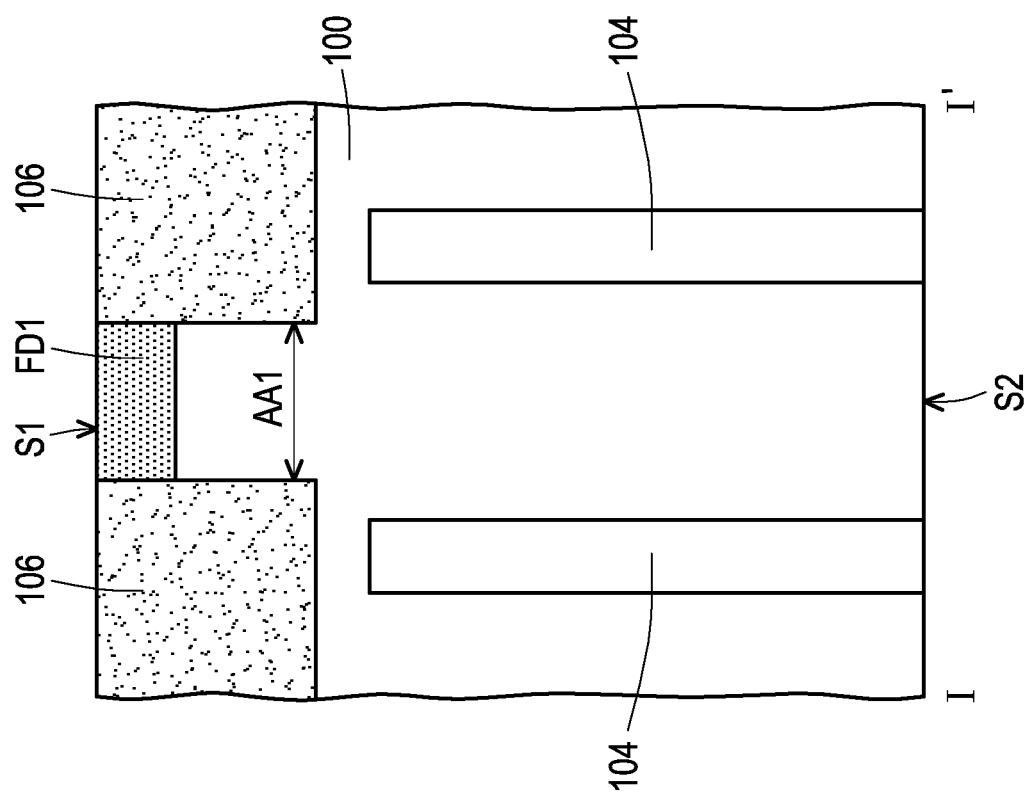
FIG. 4 is a cross-sectional view taken along section line I-I' in FIG. 2.
Figure 5:
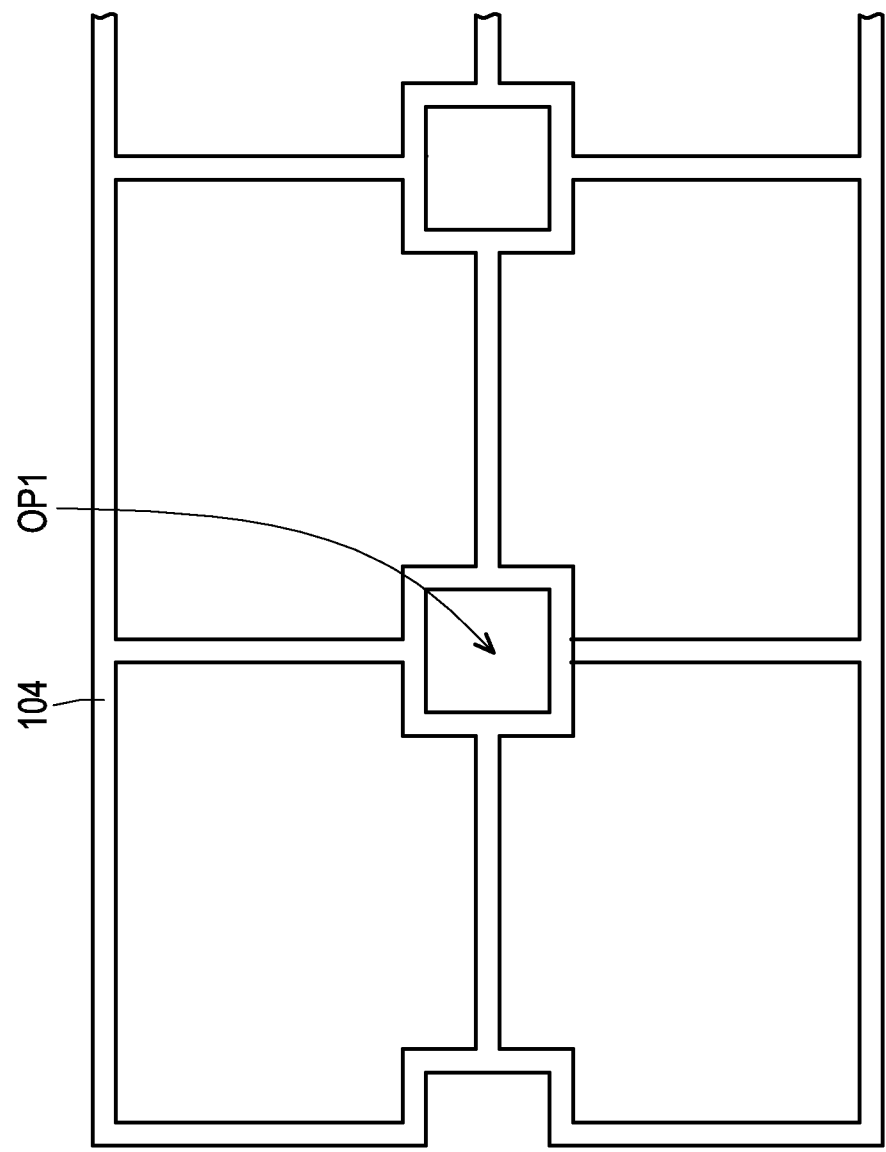
FIG. 5 is a schematic top view illustrating a DTI structure according to other embodiments of the invention.
Figure 6:
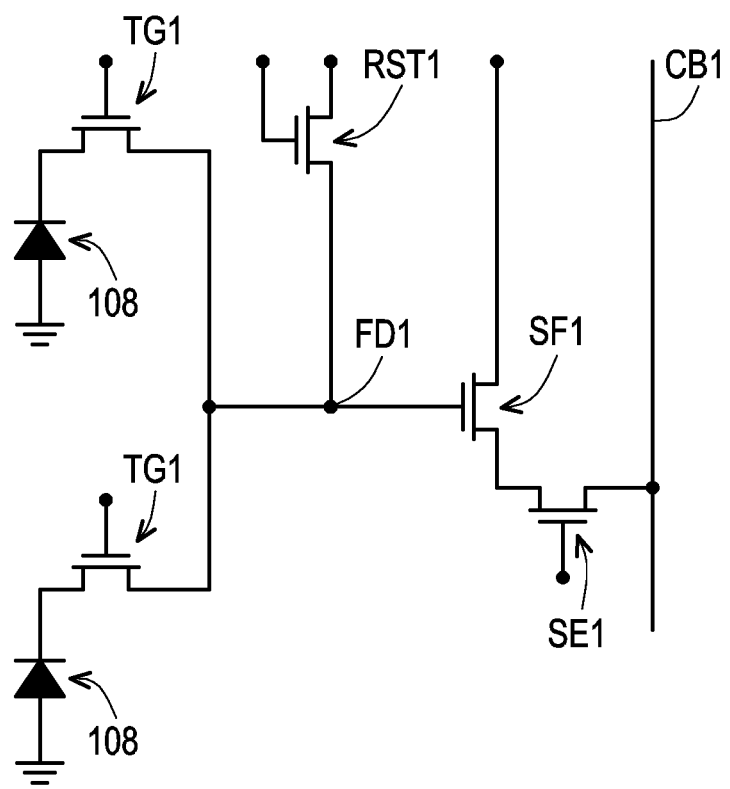
FIG. 6 is a schematic circuit diagram illustrating an image sensor structure according to some embodiments of the invention.

FIG. 1 and FIG. 2 are schematic top views illustrating an image sensor structure according to some embodiments of the invention. In FIG. 1, the deep trench isolation (DTI) structure in FIG. 2 is omitted to clearly illustrate the configuration relationship between the components in FIG. 1. FIG. 3 is a schematic top view illustrating the DTI structure in FIG. 2. FIG. 4 is a cross-sectional view taken along section line I-I' in FIG. 2. FIG. 5 is a schematic top view illustrating a DTI structure according to other embodiments of the invention. FIG. 6 is a schematic circuit diagram illustrating an image sensor structure according to some embodiments of the invention.

Referring to FIG. 1 to FIG. 4, an image sensor structure 10 includes a substrate 100, a pixel structure 102, and a deep trench isolation (DTI) structure 104. In some embodiments, the image sensor structure 10 may be a backside illuminated (BSI) image sensor structure. The substrate 100 includes a first side S1 and a second side S2 opposite to each other. In some embodiments, the first side S1 may be the front side of the substrate 100, and the second side S2 may be the back side of the substrate 100. In some embodiments, the substrate 100 may be a semiconductor substrate such as a silicon substrate. In some embodiments, the substrate 100 may have required doped regions, well regions (not shown), or the like therein, and the substrate 100 may have required dielectric layers and interconnect structures (not shown) thereon, and the description thereof is omitted here.

The image sensor structure 10 may further include a shallow trench isolation (STI) structure 106. The STI structure 106 extends into the substrate 100 from the first side S1 of the substrate 100. The STI structure 106 may define an active region AA1 in the substrate 100. In some embodiments, the STI structure 106 may further define an active region AA2 in the substrate 100. In the present embodiment, the STI structure 106 and the DTI structure 104 may be separated from each other, but the invention is not limited thereto. In other embodiments, the STI structure 106 and the DTI structure 104 may be connected to each other. In some embodiments, the material of the STI structure 106 is, for example, a dielectric material such as silicon oxide.

The pixel structure 102 includes a transfer transistor TG1, a light sensing device 108, and a floating diffusion region FD1. The transfer transistor TG1 includes a gate 110. The gate 110 is disposed on the first side S1 of the substrate 100. The gate 110 may be disposed on the active region AA1. In some embodiments, the light sensing device 108 may be used as the source of the transfer transistor TG1, and the floating diffusion region FD1 may be used as the drain of the transfer transistor TG1. In addition, the transfer transistor TG1 may further include required components such as a gate dielectric layer (not shown), and the description thereof is omitted here.

The light sensing device 108 is disposed in the substrate 100 and is located on one side of the gate 110. The light sensing device 108 may be disposed in the active region AA1. In some embodiments, the light sensing device 108 may be adjacent to the first side S1 of the substrate 100. In some embodiments, the light sensing device 108 may be a photodiode.

The floating diffusion region FD1 is disposed in the substrate 100 and is located on another side of the gate 110. The floating diffusion region FD1 may be disposed in the active region AA1. In some embodiments, the floating diffusion region FD1 may be adjacent to the first side S1 of the substrate 100. In some embodiments, the floating diffusion region FD1 may be a doped region such as an N-type doped region or a P-type doped region. For example, when the transfer transistor TG1 is an N-type metal oxide semiconductor (NMOS) transistor, the floating diffusion region FD1 may be an N-type doped region. In addition, when the transfer transistor TG1 is a P-type metal oxide semiconductor (PMOS) transistor, the floating diffusion region FD1 may be a P-type doped region.

The DTI structure 104 extends into the substrate 100 from the second side S2 of the substrate 100. The top-view pattern of the floating diffusion region FD1 does not overlap the top-view pattern of the DTI structure 104. Therefore, in the manufacturing process of the DTI structure 104, the plasma of the dry etching process can be prevented from damaging the floating diffusion region FD1, thereby reducing the fixed pattern noise and effectively improving the image quality. In some embodiments, the vertical projection of the floating diffusion region FD1 may fall outside the DTI structure 104. In some embodiments, the material of the DTI structure 104 is, for example, a dielectric material such as silicon oxide.

In some embodiments, as shown in FIG. 2, the top-view pattern of the DTI structure 104 may surround the top-view pattern of the floating diffusion region FD1. In some embodiments, as shown in FIG. 2, the top-view pattern of the DTI structure 104 may surround the top-view pattern of the light sensing device 108.

In some embodiments, as shown in FIG. 2, the top-view pattern of the DTI structure 104 may have an opening OP1. The top-view pattern of the floating diffusion region FD1 may be located in the opening OP1. In addition, the shape of the top-view pattern of the DTI structure 104 is not limited to the shape shown in FIG. 2 and FIG. 3. For example, in other embodiments, the top-view pattern of the DTI structure 104 may have a shape as shown in FIG. 5.

In the present embodiment, the image sensor structure 10 may include a plurality of the pixel structures 102, but the invention is not limited thereto. As long as the image sensor structure 10 includes at least one pixel structure 102, it falls within the scope of the invention. In the present embodiment, two pixel structures 102 may share the floating diffusion region FD1. That is, the same floating diffusion region FD1 may be shared by the two pixel structures 102.

The pixel structure 102 may further include a reset transistor RST1, a source follower transistor SF1, and a row select transistor SE1. The two pixel structures 102 may share the reset transistor RST1, the source follower transistor SF1, and the row select transistor SE1. That is, the same reset transistor RST1, the same source follower transistor SF1, and the same row select transistor SE1 may be shared by the two pixel structures 102.

The reset transistor RST1 may include a gate 112. The gate 112 is disposed on the first side S1 of the substrate 100. The gate 112 may be disposed on the active region AA1. In some embodiments, the floating diffusion region FD1 may be used as the source of the reset transistor RST1. In addition, the reset transistor RST1 may further include required components such as a gate dielectric layer and a drain (not shown), and the description thereof is omitted here.

The source follower transistor SF1 may include a gate 114. The gate 114 is disposed on the first side S1 of the substrate 100. The gate 114 may be disposed on the active region AA2. In addition, the source follower transistor SF1 may further include required components such as a gate dielectric layer, a source, and a drain (not shown), and the description thereof is omitted here.

The row select transistor SE1 may include a gate 116. The gate 116 is disposed on the first side S1 of the substrate 100. The gate 116 may be disposed on the active region AA2. In addition, the row select transistor SE1 may further include required components such as a gate dielectric layer, a source, and a drain (not shown), and the description thereof is omitted here.

In some embodiments, as shown in FIG. 2, the top-view pattern of the gate 112, the top-view pattern of the gate 114, and the top-view pattern of the gate 116 may overlap the top-view pattern of the DTI structure 104. In some embodiments, as shown in FIG. 2, the vertical projection of the gate 112, the vertical projection of the gate 114, and the vertical projection of the gate 116 may fall on the DTI structure 104.

Referring to FIG. 6, the image sensor structure 10 may further include a column bus CB1. In addition, the coupling manner of the transfer transistor TG1, the light sensing device 108, the floating diffusion region FD1, the reset transistor RST1, the source follower transistor SF1, the row select transistor SE1, and the column bus CB1 is shown in FIG. 6.

Based on the above embodiments, in the image sensor structure 10, the top-view pattern of the floating diffusion region FD1 does not overlap the top-view pattern of the DTI structure 104. Therefore, in the manufacturing process of the DTI structure 104, the plasma of the dry etching process can be prevented from damaging the floating diffusion region FD1, thereby reducing the fixed pattern noise and effectively improving the image quality.

Figure 7:
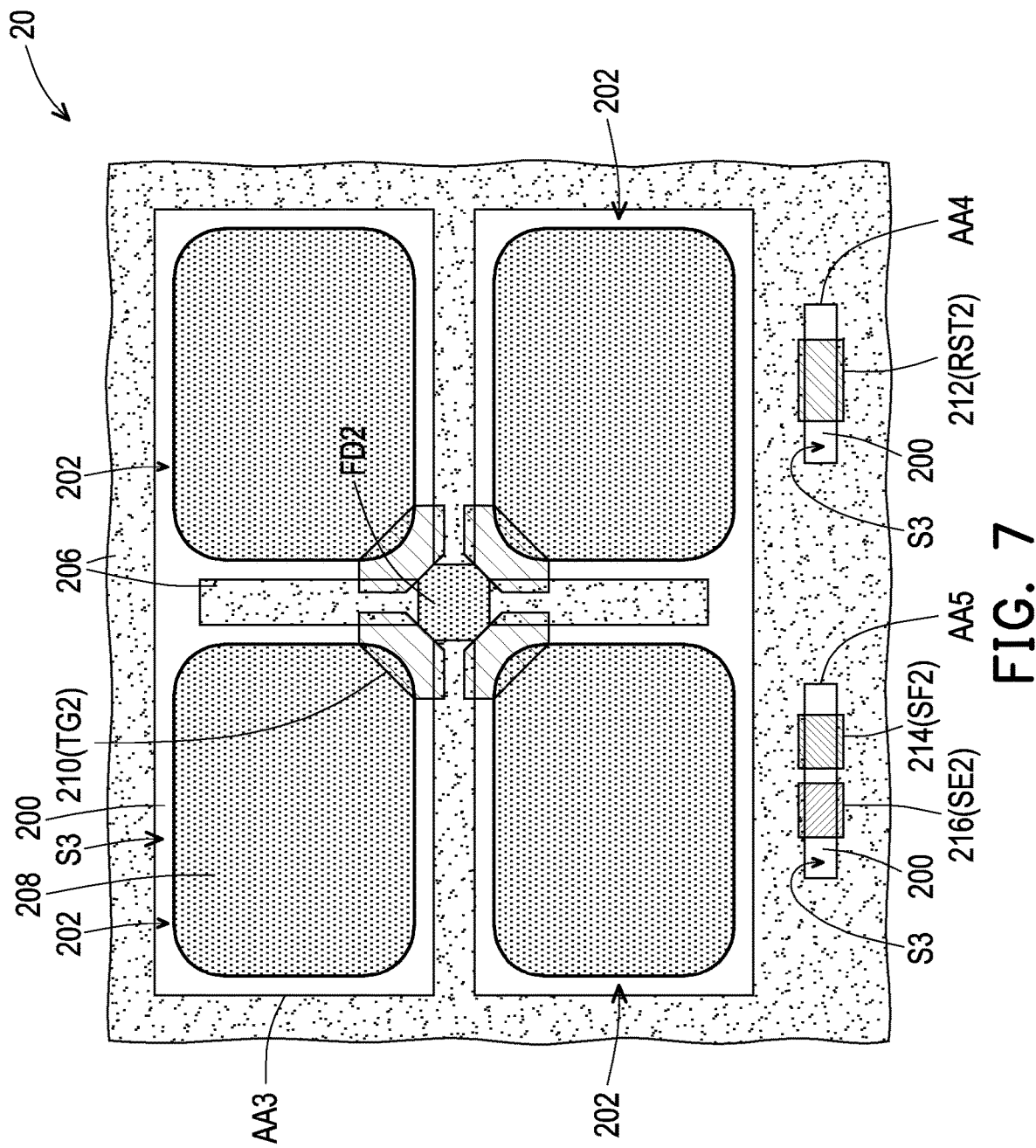
FIG. 7 and FIG. 8 are schematic top views illustrating an image sensor structure according to other embodiments of the invention.
Figure 8:
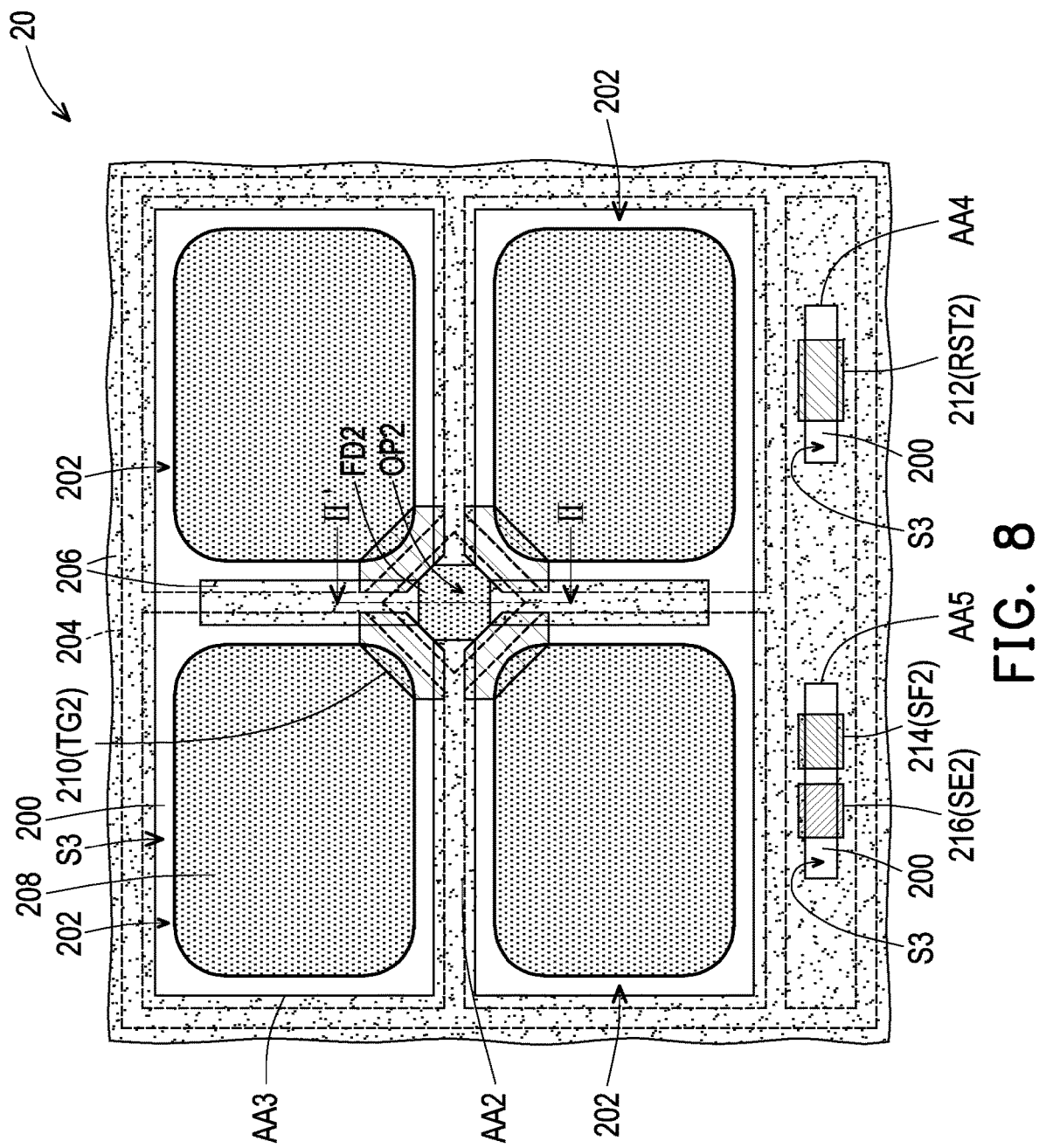
Figure 9:
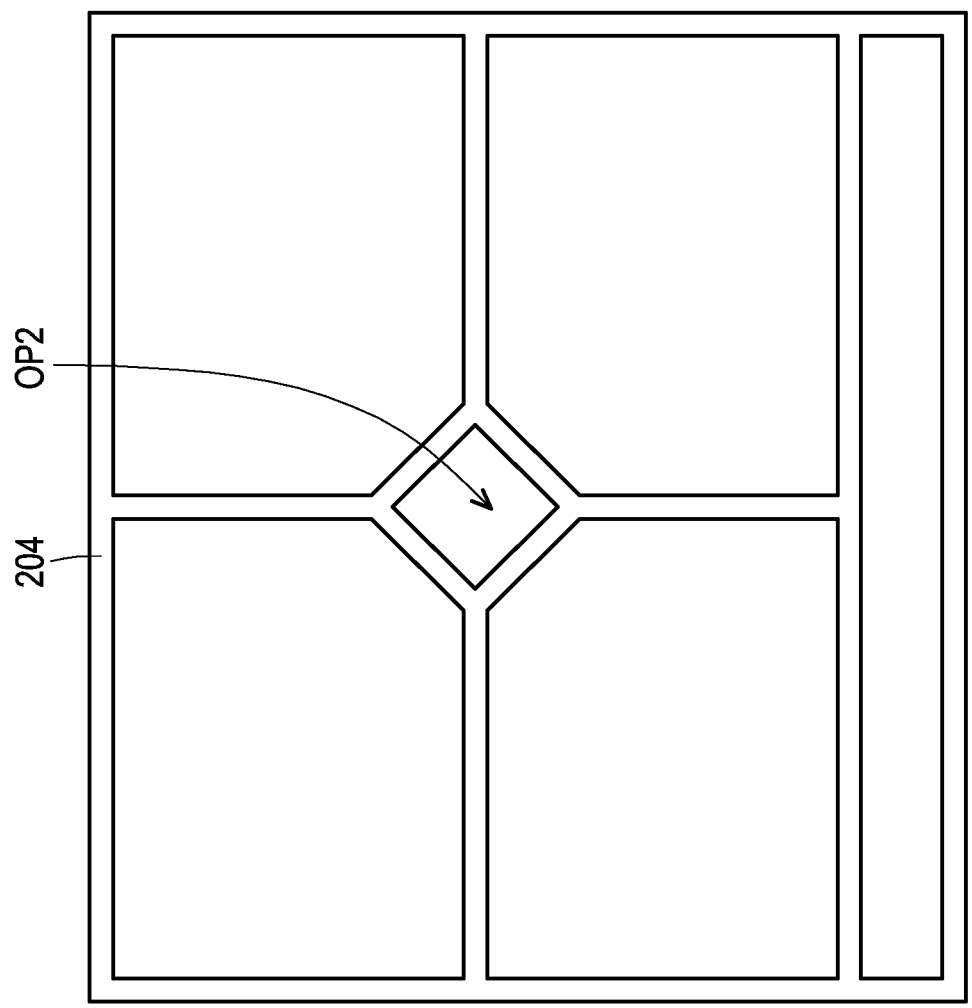
FIG. 9 is a schematic top view illustrating the DTI structure in FIG. 8.
Figure 10:
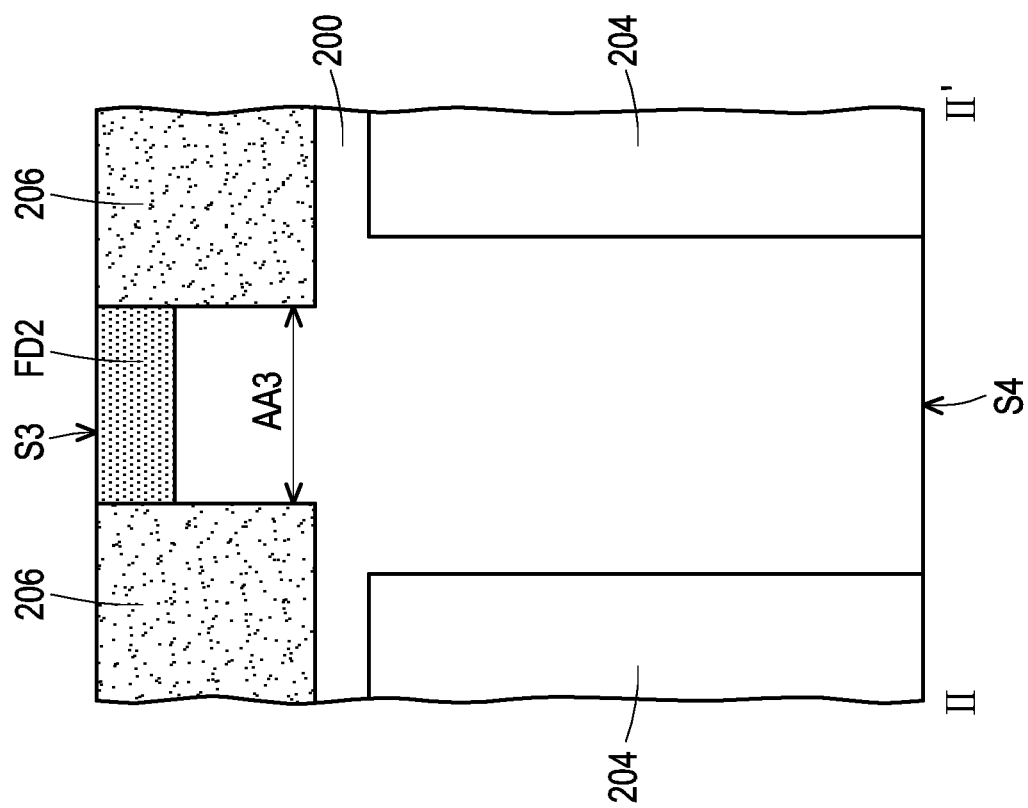
FIG. 10 is a cross-sectional view taken along section line II-II' in FIG. 8.
Figure 11:
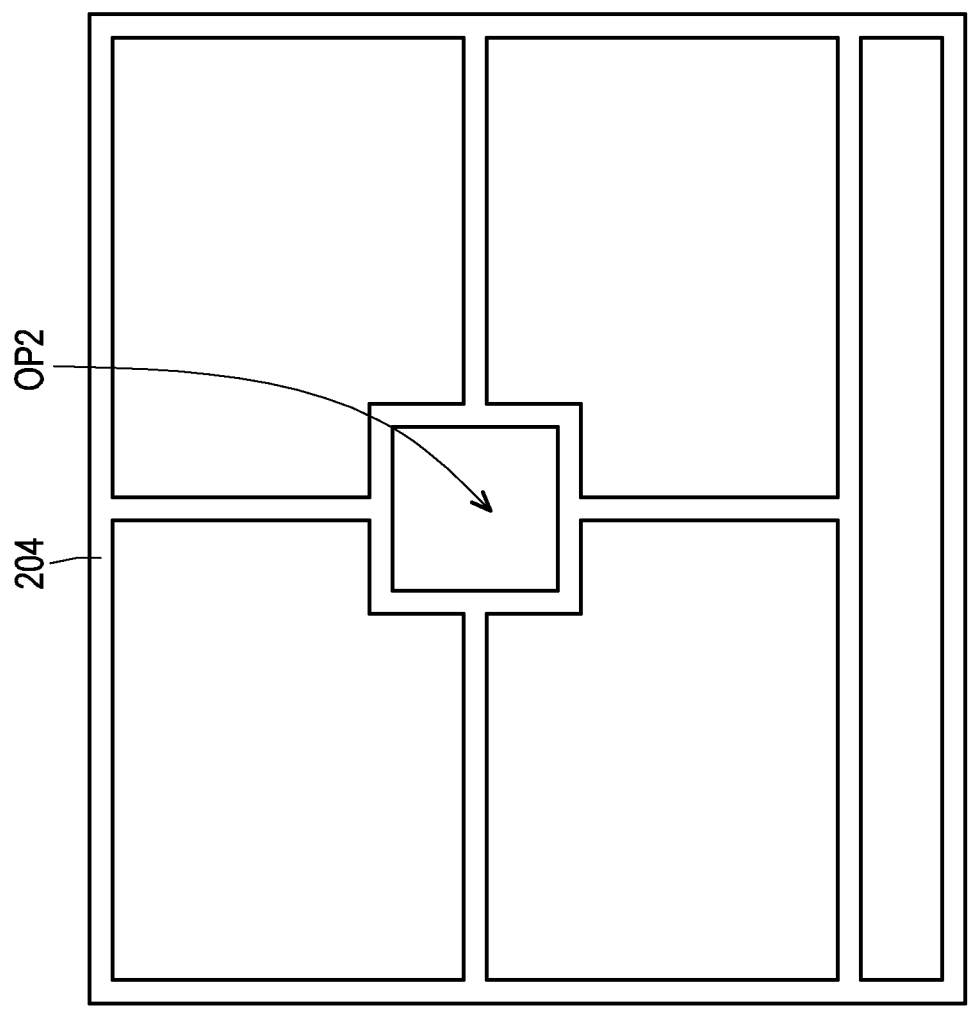
FIG. 11 is a schematic top view illustrating a DTI structure according to other embodiments of the invention.
Figure 12:
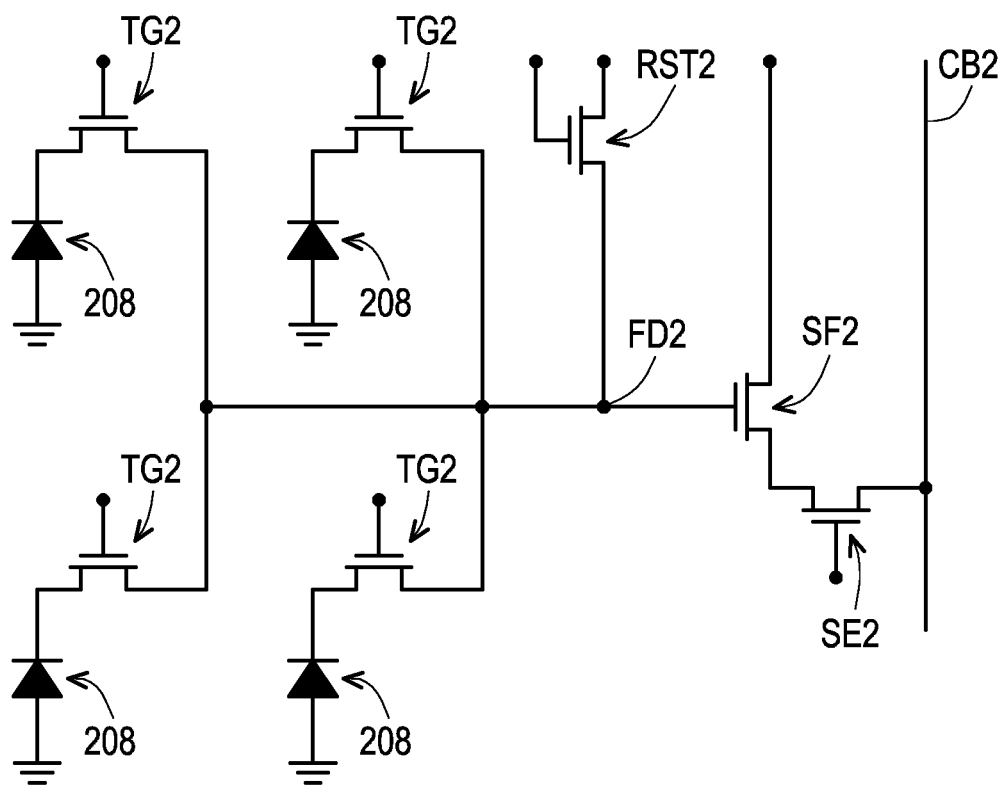
FIG. 12 is a schematic circuit diagram illustrating an image sensor structure according to other embodiments of the invention.

FIG. 7 and FIG. 8 are schematic top views illustrating an image sensor structure according to other embodiments of the invention. In FIG. 7, the DTI structure in FIG. 8 is omitted to clearly illustrate the configuration relationship between the components in FIG. 7. FIG. 9 is a schematic top view illustrating the DTI structure in FIG. 8. FIG. 10 is a cross-sectional view taken along section line II-II' in FIG. 8. FIG. 11 is a schematic top view illustrating a DTI structure according to other embodiments of the invention. FIG. 12 is a schematic circuit diagram illustrating an image sensor structure according to other embodiments of the invention.

Referring to FIG. 7 to FIG. 10, an image sensor structure 20 includes a substrate 200, a pixel structure 202, and a DTI structure 204. In some embodiments, the image sensor structure may be a BSI image sensor structure. The substrate 200 includes a first side S3 and a second side S4 opposite to each other. In some embodiments, the first side S3 may be the front side of the substrate 200, and the second side S4 may be the back side of the substrate 200. In some embodiments, the substrate 200 may be a semiconductor substrate such as a silicon substrate. In some embodiments, the substrate 200 may have required doped regions, well regions (not shown), or the like therein, and the substrate 200 may have required dielectric layers and interconnect structures (not shown) thereon, and the description thereof is omitted here.

The image sensor structure 20 may further include a STI structure 206. The STI structure 206 extends into the substrate 200 from the first side S3 of the substrate 200. The STI structure 206 may define an active region AA3 in the substrate 200. In some embodiments, the STI structure 206 may further define an active region AA4 and an active region AA5 in the substrate 200. In the present embodiment, the STI structure 206 and the DTI structure 204 may be separated from each other, but the invention is not limited thereto. In other embodiments, the STI structure 206 and the DTI structure 204 may be connected to each other. In some embodiments, the material of the STI structure 206 is, for example, a dielectric material such as silicon oxide.

The pixel structure 202 includes a transfer transistor TG2, a light sensing device 208, and a floating diffusion region FD2. The transfer transistor TG2 includes a gate 210. The gate 210 is disposed on the first side S3 of the substrate 200. The gate 210 may be disposed on the active region AA3. In some embodiments, the light sensing device 208 may be used as the source of the transfer transistor TG2, and the floating diffusion region FD2 may be used as the drain of the transfer transistor TG2. In addition, the transfer transistor TG2 may further include required components such as a gate dielectric layer (not shown), and the description thereof is omitted here.

The light sensing device 208 is disposed in the substrate 200 and is located on one side of the gate 210. The light sensing device 208 may be disposed in the active region AA3. In some embodiments, the light sensing device 208 may be adjacent to the first side S3 of the substrate 200. In some embodiments, the light sensing device 208 may be a photodiode.

The floating diffusion region FD2 is disposed in the substrate 200 and is located on another side of the gate 210. The floating diffusion region FD2 may be disposed in the active region AA3. In some embodiments, the floating diffusion region FD2 may be adjacent to the first side S3 of the substrate 200. In some embodiments, the floating diffusion region FD2 may be a doped region such as an N-type doped region or a P-type doped region. For example, when the transfer transistor TG2 is an NMOS transistor, the floating diffusion region FD2 may be an N-type doped region. In addition, when the transfer transistor TG2 is a PMOS transistor, the floating diffusion region FD2 may be a P-type doped region.

The DTI structure 204 extends into the substrate 200 from the second side S4 of the substrate 200. The top-view pattern of the floating diffusion region FD2 does not overlap the top-view pattern of the DTI structure 204. Therefore, in the manufacturing process of the DTI structure 204, the plasma of the dry etching process can be prevented from damaging the floating diffusion region FD2, thereby reducing the fixed pattern noise and effectively improving the image quality. In some embodiments, the vertical projection of the floating diffusion region FD2 may fall outside the DTI structure 204. In some embodiments, the material of the DTI structure 204 is, for example, a dielectric material such as silicon oxide.

In some embodiments, as shown in FIG. 8, the top-view pattern of the DTI structure 204 may surround the top-view pattern of the floating diffusion region FD2. In some embodiments, as shown in FIG. 8, the top-view pattern of the DTI structure 204 may surround the top-view pattern of the light sensing device 208.

In some embodiments, as shown in FIG. 8, the top-view pattern of the DTI structure 204 may have an opening OP2. The top-view pattern of the floating diffusion region FD2 may be located in the opening OP2. In addition, the shape of the top-view pattern of the DTI structure 204 is not limited to the shape shown in FIG. 8 and FIG. 9. For example, in other embodiments, the top-view pattern of the DTI structure 204 may have a shape as shown in FIG. 11.

In the present embodiment, the image sensor structure 20 may include a plurality of the pixel structures 202, but the invention is not limited thereto. As long as the image sensor structure 20 includes at least one pixel structure 202, it falls within the scope of the invention. In the present embodiment, four pixel structures 202 may share the floating diffusion region FD2. That is, the same floating diffusion region FD2 may be shared by the four pixel structures 202.

The pixel structure 202 may further include a reset transistor RST2, a source follower transistor SF2, and a row select transistor SE2. The four pixel structures 202 may share the reset transistor RST2, the source follower transistor SF2, and the row select transistor SE2. That is, the same reset transistor RST2, the same source follower transistor SF2, and the same row select transistor SE2 may be shared by the four pixel structures 202.

The reset transistor RST2 may include a gate 212. The gate 212 is disposed on the first side S3 of the substrate 200. The gate 212 may be disposed on the active region AA4. In addition, the reset transistor RST2 may further include required components such as a gate dielectric layer, a source, and a drain (not shown), and the description thereof is omitted here.

The source follower transistor SF2 may include a gate 214. The gate 214 is disposed on the first side S3 of the substrate 200. The gate 214 may be disposed on the active region AA5. In addition, the source follower transistor SF2 may further include required components such as a gate dielectric layer, a source, and a drain (not shown), and the description thereof is omitted here.

The row select transistor SE2 may include a gate 216. The gate 216 is disposed on the first side S3 of the substrate 200. The gate 216 may be disposed on the active region AA5. In addition, the row select transistor SE2 may further include required components such as a gate dielectric layer, a source, and a drain (not shown), and the description thereof is omitted here.

In some embodiments, as shown in FIG. 8, the top-view pattern of the gate 212, the top-view pattern of the gate 214, and the top-view pattern of the gate 216 may not overlap the top-view pattern of the DTI structure 204. In some embodiments, as shown in FIG. 8, the vertical projection of the gate 212, the vertical projection of the gate 214, and the vertical projection of the gate 216 may fall outside the DTI structure 204. In some embodiments, as shown in FIG. 8, the top-view pattern of the DTI structure 204 may surround the top-view pattern of the gate 212, the top-view pattern of the gate 214, and the top-view pattern of the gate 216.

Referring to FIG. 12, the image sensor structure 20 may further include a column bus CB2. In addition, the coupling manner of the transfer transistor TG2, the light sensing device 208, the floating diffusion region FD2, the reset transistor RST2, the source follower transistor SF2, the row select transistor SE2, and the column bus CB2 is shown in FIG. 12.

Based on the above embodiments, in the image sensor structure 20, the top-view pattern of the floating diffusion region FD2 does not overlap the top-view pattern of the DTI structure 204. Therefore, in the manufacturing process of the DTI structure 204, the plasma of the dry etching process can be prevented from damaging the floating diffusion region FD2, thereby reducing the fixed pattern noise and effectively improving the image quality.

In summary, in the image sensor structure of the aforementioned embodiments, the top-view pattern of the floating diffusion region does not overlap the top-view pattern of the DTI structure. Therefore, in the manufacturing process of the DTI structure, the plasma of the dry etching process can be prevented from damaging the floating diffusion region, thereby reducing the fixed pattern noise and effectively improving the image quality.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An image sensor structure, comprising:
a substrate comprising a first side and a second side opposite to each other;
a pixel structure comprising:
a transfer transistor comprising a first gate, wherein the first gate is disposed on the first side of the substrate;
a light sensing device disposed in the substrate and located on one side of the first gate; and
a floating diffusion region disposed in the substrate and located on another side of the first gate; and
a deep trench isolation (DTI) structure extending into the substrate from the second side of the substrate, wherein a top-view pattern of the floating diffusion region does not overlap a top-view pattern of the DTI structure,
the image sensor structure comprises a plurality of the pixel structures,
four pixel structures of the plurality of the pixel structures share the floating diffusion region,
the pixel structure further comprises a reset transistor, a source follower transistor, and a row select transistor, and the four pixel structures share the reset transistor, the source follower transistor, and the row select transistor,
the reset transistor comprises a second gate, wherein the second gate is disposed on the first side of the substrate,
the source follower transistor comprises a third gate, wherein the third gate is disposed on the first side of the substrate,
the row select transistor comprises a fourth gate, wherein the fourth gate is disposed on the first side of the substrate,
the top-view pattern of the DTI structure has a plurality of openings separated from each other,
the top-view pattern of the floating diffusion region and a top-view pattern of the second gate are located in different openings of the plurality of the openings,
the top-view pattern of the floating diffusion region and a top-view pattern of the third gate are located in different openings of the plurality of the openings, and
the top-view pattern of the floating diffusion region and a top-view pattern of the fourth gate are located in different openings of the plurality of the openings.

2. The image sensor structure according to claim 1, wherein the image sensor structure comprises a backside illuminated image sensor structure.

3. The image sensor structure according to claim 1, wherein the light sensing device comprises a photodiode.

4. The image sensor structure according to claim 1, wherein a vertical projection of the floating diffusion region falls outside the DTI structure.

5. The image sensor structure according to claim 1, wherein the top-view pattern of the DTI structure surrounds the top-view pattern of the floating diffusion region.

6. The image sensor structure according to claim 1, wherein the top-view pattern of the DTI structure surrounds a top-view pattern of the light sensing device.

7. The image sensor structure according to claim 1, wherein a top-view pattern of the second gate, a top-view pattern of the third gate, and a top-view pattern of the fourth gate do not overlap the top-view pattern of the DTI structure.

8. The image sensor structure according to claim 1, wherein a vertical projection of the second gate, a vertical projection of the third gate, and a vertical projection of the fourth gate fall outside the DTI structure.

9. The image sensor structure according to claim 1, wherein the top-view pattern of the DTI structure surrounds a top-view pattern of the second gate, a top-view pattern of the third gate, and a top-view pattern of the fourth gate.

10. The image sensor structure according to claim 1, further comprising:
a shallow trench isolation structure extending into the substrate from the first side of the substrate and defining an active region in the substrate, wherein the light sensing device and the floating diffusion region are disposed in the active region.

* * * * *